United States Patent
Basin (10) Patent No.: US 11,550,973 B2
(45) Date of Patent: Jan. 10, 2023

(54) DATA STRUCTURES AND PROCESSING METHODS FOR HIGHLY SCALABLE SIMULATION PLATFORMS

(71) Applicant: NOBLIS, INC., Reston, VA (US)

(72) Inventor: Ilya Basin, Vienna, VA (US)

(73) Assignee: NOBLIS, INC., Reston, VA (US)

( * ) Notice: Subject to any disclaimer, the term of this patent is extended or adjusted under 35 U.S.C. 154(b) by 74 days.

(21) Appl. No.: 17/347,020

(22) Filed: Jun. 14, 2021

(65) Prior Publication Data

US 2021/0374310 A1 Dec. 2, 2021

Related U.S. Application Data (63) Continuation of application No. 16/381,282, filed on Apr. 11, 2019, now Pat. No. 11,036,903.

(60) Provisional application No. 62/714,837, filed on Aug. 6, 2018.

(51) Int. Cl.
| | |
|---|---|
| *G06F 30/20* | (2020.01) |
| *G06F 16/28* | (2019.01) |
| *G06F 16/245* | (2019.01) |
| *G06F 16/22* | (2019.01) |

(52) U.S. Cl.
CPC .......... *G06F 30/20* (2020.01); *G06F 16/2228* (2019.01); *G06F 16/245* (2019.01); *G06F 16/285* (2019.01)

(58) Field of Classification Search
None
See application file for complete search history.

(56) References Cited

U.S. PATENT DOCUMENTS

| 9,985,825 B2 | 5/2018 | Huang |
| 2010/0162156 A1 | 6/2010 | Tolone et al. |
| 2010/0211912 A1 | 8/2010 | Williams |
| 2011/0022198 A1 | 1/2011 | Plache et al. |
| 2014/0172393 A1 | 6/2014 | Kang et al. |
| 2017/0098020 A1 | 4/2017 | Samuel et al. |
| 2017/0201413 A1 | 7/2017 | Marinelli et al. |
| 2017/0201425 A1 | 7/2017 | Marinelli et al. |

(Continued)

OTHER PUBLICATIONS

Krause, Office Action dated Mar. 11, 2022, directed to U.S. Appl. No. 16/276,894; 12 pages.

(Continued)

*Primary Examiner* — Craig C Dorais
(74) *Attorney, Agent, or Firm* — Morrison & Foerster LLP (57) ABSTRACT

Disclosed herein are systems and methods for simulating an environment over a plurality of intervals of in-simulation time by using a two-part data structure to represent agents or entities in the simulation. A system may create and store a data structure representing an agent in the simulation, wherein a first portion of the data structure represents characteristics of the agent at a present interval and a second portion of data structure represents characteristics of the agent at a future interval of the simulation. Also disclosed herein are systems and methods for executing a multi-agent simulation using multiple processing threads. A system may group a plurality of agents in the simulated environment into subsets associated respectively with nodes of the simulated environment, assign the subsets to respective separate processors of the system, and execute the simulation using separate processing threads associated respectively with the separate processors.

15 Claims, 5 Drawing Sheets

(56) References Cited

U.S. PATENT DOCUMENTS

| | | |
|---|---|---|
| 2017/0249402 A1 | 8/2017 | Liu et al. |
| 2017/0316324 A1 | 11/2017 | Barrett et al. |
| 2017/0371074 A1 | 12/2017 | Elkabetz et al. |
| 2018/0067832 A1 | 3/2018 | Suzuki |
| 2018/0095619 A1 | 4/2018 | Liu et al. |
| 2018/0159881 A1 | 6/2018 | Crabtree et al. |
| 2019/0259108 A1 | 8/2019 | Bongartz et al. |
| 2019/0266297 A1 | 8/2019 | Krause |
| 2019/0324437 A1 | 10/2019 | Celia et al. |
| 2019/0324438 A1 | 10/2019 | Celia et al. |
| 2019/0349426 A1 | 11/2019 | Smith et al. |
| 2019/0372798 A1 | 12/2019 | Soya et al. |
| 2020/0027096 A1 | 1/2020 | Cooner |
| 2020/0225655 A1 | 7/2020 | Cella et al. |
| 2020/0310946 A1 | 10/2020 | Nelson et al. |
| 2020/0342511 A1 | 10/2020 | Bursey |
| 2021/0036930 A1 | 2/2021 | Marinelli et al. |
| 2022/0046779 A1 | 2/2022 | Mirsky et al. |
| 2022/0057254 A1 | 2/2022 | Ji et al. |
| 2022/0070211 A1 | 3/2022 | Keshtkarjahromi |

OTHER PUBLICATIONS

Basin, Notice of Allowance dated May 4, 2021, directed to U.S. Appl. No. 16/381,282; 14 pages.

Biagi et al. "Using Simulation to Evaluate LTE Load Control For Priority Users," Winter Simulation Conference, Dec. 11-14, 2016, Arlington, Virginia; pp. 3177-3188.

Fischer et al. "On the Relationship Between the Low Latency Queueing and the Non-Preemptive Priority Queueing Model," 9th INFORMS Telecommunications Conference, Mar. 27-29, 2008, College Park, Maryland; 27 pages.

Garbin et al. "Using Event Simulation to Evaluate Internet Protocol Enhancements for Special Services," Winter Simulation Conference, Dec. 9-12, 2007, Washington, D.C.; pp. 2276-2284.

Gordon et al. "UMTS Load Control with Access Class Barring," IEEE Military Communications Conference (MILCOM), Oct. 6-9, 2014, Baltimore, Maryland; pp. 1009-1014.

Masi et al. "Measuring Resilience in Multi-Carrier Emergency and Critical Telecommunications Systems," IEEE Military Communications Conference (MILCOM), Nov. 17-19, 2008, San Diego, California; 7 pages.

Masi et al. "Simulating Network Cyber Attacks Using Splitting Techniques," Winter Simulation Conference, Dec. 11-14, 2011, Phoenix, Arizona; pp. 3212-3223.

Masi et al. "Voice over Internet Protocol (VoIP) Performance Models—A Comprehensive Approach," International Conference on Telecommunication Systems, Nov. 17-20, 2005, Dallas, Texas; 29 pages.

Shortle et al. "An Effective Rare-event Simulation Technique and Its Application to Cyber Security and Electric Grid," Workshop on Grand Challenges in Modeling, Simulation and Analysis for Homeland Security (MSAHS), Mar. 17-18, 2010, Arlington, Virginia; 6 pages.

- 302 – Create and store time-interval data structure comprising first interval representation and second interval representation
  - 304 – Store characteristics of agent at initial state in both the first representation and the second representation

- 306 – Configure first representation as representing interval N and second representation as representing interval N+1
  - 308 – Configure first representation as read-only and the second representation as write-only
  - 310 – Store indicator indicating first representation as representing interval N and indicating second representation as representing interval N+1

- 312 – Execute present iteration of simulation
  - 314 – Read data regarding the represented agent from representation configured as representing interval N
  - 316 – Write data regarding the represented agent to representation configured as representing interval N+1
    - 318 – Write data to every field of representation configured as representing interval N+1

- 320 – When present iteration of simulation is complete, reverse configuration of representations

- 322 – When present iteration of simulation is complete, copy data from representation configured as representing interval N+1 to representation configured as representing interval N

402 – Group plurality of agents in simulation into a plurality of subsets for current simulation iteration, each subset associated with a node of the simulation

404 – Perform a single query per node to determine all agents associated with the node

406 – Group agents based on common associated inflection points

408 – Assign each of the plurality of agents to a next inflection point that will be reached by the agent

410 – If an agent will reach more than one inflection point during the current simulation iteration, reduce a speed of the agent such that it will only encounter a single inflection point during the current simulation iteration.

---

412 – Assign subsets of agents to single respective threads

414 – Execute simulation iteration using assigned threads to perform calculations for associated subsets of agents

DATA STRUCTURES AND PROCESSING METHODS FOR HIGHLY SCALABLE SIMULATION PLATFORMS

CROSS-REFERENCE TO RELATED APPLICATIONS

This application is a continuation of U.S. application Ser. No. 16/381,282, filed Apr. 11, 2019, which claims the benefit of U.S. Provisional Application No. 62/714,837 filed Aug. 6, 2018, the entire contents of each of which are incorporated herein by reference.

FIELD OF THE INVENTION

This relates generally to simulation platforms, and more specifically to platforms using data-structures and processing methods for highly-scalable simulations.

BACKGROUND OF THE INVENTION

The threat of incapacitation or destruction of cyber-physical systems (CPS) due to malicious hacking, software bugs, natural disasters, and other disruptions is a recognized threat to national security, economic security, and public health. Using current systems, operators are currently ill-equipped to understand and predict the second-order and third-order effects that may be caused by chain reactions in complex systems having multiple interrelated infrastructure sectors, such as transportation, communication, electrical, water, weather, fuel, and consumables.

While modeling and simulation of critical infrastructure sectors and interrelated CPS systems is recognized by private corporations and government agencies as a potential solution to address the above threats, current simulation systems are incapable of accurately simulating large-scale CPS environments. For example, known simulation platforms may provide the capability to simulate a maximum of about 40,000 agents in a simulated environment, while a realistic simulation of a large city or other large-scale environment might call for simulating hundreds of thousands or millions of agents.

SUMMARY OF THE INVENTION

As described above, known simulation solutions are unable to fully and accurately simulate large-scale multi-sector CPS environments. Namely, while known simulation platforms may provide the capability to simulate a maximum of about 40,000 agents in a simulated environment, they are incapable of fully and accurately simulating environments with hundreds of thousands or millions of agents, which may be necessary for simulation of large-scale environments such as modern cities. For example, due to the fact that computing resources required to run known simulation platforms do not scale linearly with the number of agents being simulated, even the most powerful known computer systems are incapable of simulating hundreds of thousands or millions of agents. Thus, there is a need for improved simulation platforms and associated computer systems in order to provide the capability to accurately and quickly simulate complex CPS environments having large numbers of interrelated infrastructure layers and having hundreds of thousands or millions of agents.

Disclosed herein are systems and methods for creating and implementing simulation platforms that may address the problems explained above. In some embodiments, the systems and methods disclosed herein may leverage in-memory and/or in-process databases in order to improve achiever flat query-processing times that may be on the order of one millisecond and accordingly achieve near-linear scalability for database size. Additionally, in some embodiments, the systems and methods disclosed herein may leverage novel asynchronous node-based time-interval structures that may represent agents in a simulation in a manner that enables efficient allocation and minimized de-allocation of memory space over a large number of intervals of in-simulation time. Additionally, in some embodiments, the system and methods disclosed herein may enable allocating processing resources based on nodes, such that a group of agents associated with a common node may be assigned to a single processing thread, thereby reducing thread contention caused by different threads competing for access to the same resource. Finally, in some embodiments, the systems and methods disclosed herein may comprise using atomic increment and decrement operations (e.g., interlock increment/decrement operations in C#) in order to improve the speed and efficiency of using multiple processing threads. In accordance with one or more of the systems and methods disclosed herein, CPS simulations with hundreds of thousands of agents in a single simulation may thus be enabled.

In some embodiments, a first system is provided, the first system being for simulating an environment over a plurality of intervals of in-simulation time, the first system comprising: one or more processors; and memory storing one or more programs, wherein the one or more programs are configured to be executable by the one or more processors to cause the system to: create and store a data structure representing an agent in a simulation, wherein the data structure comprises a first portion representing one or more characteristics of the agent at a first time interval of the simulation and a second portion representing the one or more characteristics of the agent at a second time interval of the simulation; configure the first portion to represent the one or more characteristics of the agent at a present interval of the simulation; configure the second interval to represent the one or more characteristics of the agent at a future interval of the simulation; execute the present interval of the simulation; after executing the present interval of the simulation, reverse the configuration of the first portion of the data structure and the second portion of the data structure by configuring the first portion to represent the one or more characteristics of the agent at a new future interval of the simulation and configuring the second interval to represent the one or more characteristics of the agent at a new present interval of the simulation.

In some embodiments of the first system, creating and storing the data structure comprises storing data representing an initial state of the agent in both the first portion and the second portion of the data structure.

In some embodiments of the first system: configuring the first portion to represent the one or more characteristics of the agent at a present interval of the simulation comprises configuring data stored in the first portion as read-only data; and configuring the second interval to represent the one or more characteristics of the agent at a future interval of the simulation comprises configuring data stored in the second portion as write-only data.

In some embodiments of the first system, executing the present interval of the simulation comprises: reading data regarding the one or more characteristics of the agent at the present interval from the first portion of the data structure;

and writing data regarding the one or more characteristics of the agent at the future interval to the second portion of the data structure.

In some embodiments of the first system, writing data regarding the one or more characteristics of the agent at the future interval to the second portion of the data structure comprises writing data to each of a plurality of fields included in the second portion of the data structure.

In some embodiments, a first method is provided, the first method being for simulating an environment over a plurality of intervals of in-simulation time, the first method comprising: at a simulation system comprising one or more processors and storage: creating and storing a data structure representing an agent in a simulation, wherein the data structure comprises a first portion representing one or more characteristics of the agent at a first time interval of the simulation and a second portion representing the one or more characteristics of the agent at a second time interval of the simulation; configuring the first portion to represent the one or more characteristics of the agent at a present interval of the simulation; configuring the second interval to represent the one or more characteristics of the agent at a future interval of the simulation; executing the present interval of the simulation; after executing the present interval of the simulation, reversing the configuration of the first portion of the data structure and the second portion of the data structure by configuring the first portion to represent the one or more characteristics of the agent at a new future interval of the simulation and configuring the second interval to represent the one or more characteristics of the agent at a new present interval of the simulation.

In some embodiments, a first non-transitory computer-readable medium is provided, the first non-transitory computer-readable medium being for simulating an environment over a plurality of intervals of in-simulation time, wherein the first non-transitory computer-readable storage medium stores instructions that, when executed by one or more processors of a simulation system, cause the simulation system to: create and store a data structure representing an agent in a simulation, wherein the data structure comprises a first portion representing one or more characteristics of the agent at a first time interval of the simulation and a second portion representing the one or more characteristics of the agent at a second time interval of the simulation; configure the first portion to represent the one or more characteristics of the agent at a present interval of the simulation; configure the second interval to represent the one or more characteristics of the agent at a future interval of the simulation; execute the present interval of the simulation; after executing the present interval of the simulation, reverse the configuration of the first portion of the data structure and the second portion of the data structure by configuring the first portion to represent the one or more characteristics of the agent at a new future interval of the simulation and configuring the second interval to represent the one or more characteristics of the agent at a new present interval of the simulation.

In some embodiments, a second system is provided, the second system being for simulating an environment over a plurality of intervals of in-simulation time, the second system comprising: one or more processors; and memory storing one or more programs, wherein the one or more programs are configured to be executable by the one or more processors to cause the system to: create and store a data structure representing an agent in a simulation, wherein the data structure comprises a first portion representing one or more characteristics of the agent at a first time interval of the simulation and a second portion representing the one or more characteristics of the agent at a second time interval of the simulation; configure the first portion to represent the one or more characteristics of the agent at a present interval of the simulation; configure the second interval to represent the one or more characteristics of the agent at a future interval of the simulation; execute the present interval of the simulation; after executing the present interval of the simulation and before executing the future interval of the simulation, copy data regarding the one or more characteristics of the agent from the second portion of the second portion of the data structure to the first portion of the data structure.

In some embodiments of the second system, the one or more programs are configured to be executable by the one or more processors to cause the system to: after executing the present interval of the simulation, execute the future interval of the simulation by reading data regarding the one or more characteristics of the agent from the first portion of the data structure and writing data regarding the one or more characteristics of the agent to the second portion of the data structure.

In some embodiments, a second method is provided, the second method being for simulating an environment over a plurality of intervals of in-simulation time, the second method comprising: creating and store a data structure representing an agent in a simulation, wherein the data structure comprises a first portion representing one or more characteristics of the agent at a first time interval of the simulation and a second portion representing the one or more characteristics of the agent at a second time interval of the simulation; configuring the first portion to represent the one or more characteristics of the agent at a present interval of the simulation; configuring the second interval to represent the one or more characteristics of the agent at a future interval of the simulation; executing the present interval of the simulation; after executing the present interval of the simulation and before executing the future interval of the simulation, copying data regarding the one or more characteristics of the agent from the second portion of the second portion of the data structure to the first portion of the data structure.

In some embodiments, a second non-transitory computer-readable storage medium is provided, the second non-transitory computer-readable storage medium being for simulating an environment over a plurality of intervals of in-simulation time, wherein the second non-transitory computer-readable storage medium stores instructions that, when executed by one or more processors of a simulation system, cause the simulation system to: create and store a data structure representing an agent in a simulation, wherein the data structure comprises a first portion representing one or more characteristics of the agent at a first time interval of the simulation and a second portion representing the one or more characteristics of the agent at a second time interval of the simulation; configure the first portion to represent the one or more characteristics of the agent at a present interval of the simulation; configure the second interval to represent the one or more characteristics of the agent at a future interval of the simulation; execute the present interval of the simulation; after executing the present interval of the simulation and before executing the future interval of the simulation, copy data regarding the one or more characteristics of the agent from the second portion of the second portion of the data structure to the first portion of the data structure.

In some embodiments, a third system is provided, the third system being for executing a simulation comprising a plurality of agents using multiple processing threads, the third system comprising: two or more processors; memory storing one or more programs, wherein the one or more programs are configured to be executable by one or more of the two or more processors to cause the system to: group a plurality of agents in the simulated environment into a first subset and a second subset, wherein the first subset is associated with a first node of the simulated environment and the second subset is associated with a second node of the simulated environment; assign the first subset to a first processor of the two or more processors; assign the second subset to a second processor of the two or more processors; and execute the simulation using a first processing thread associated with the first processor to perform calculations for agents in the first subset and using a second processing thread associated with the second processor to perform calculations for agents in the second subset.

In some embodiments of the third system, grouping the plurality of agents into the first subset and the second subset comprises: performing a first query to identify all agents associated with the first node to be grouped into the first subset; and performing a second query to identify all agents associated with the second node to be grouped into the second subset.

In some embodiments of the third system, the first query and the second query are performed against a flat-query-time database.

In some embodiments of the third system: the first node is a first inflection point in the simulated environment; the second node is a second inflection point in the simulated environment; and grouping the plurality of agents into the first subset and the second subset comprises grouping agents associated with the first inflection point into the first subset and grouping agents associated with the second inflection point into the second subset.

In some embodiments of the third system, the one or more programs are further configured to be executable by one or more of the two or more processors to cause the system to: if the system determines that an agent will reach the first inflection point during a current interval of the simulation, determine that the agent is associate with the first inflection point; and if the system determines that an agent will reach the second inflection point during the current interval of the simulation, determine that the agent is associated with the second inflection point.

In some embodiments of the third system, the one or more programs are further configured to be executable by one or more of the two or more processors to cause the system to: if the system determines that an agent will reach more than one inflection point during a current interval of the simulation, reducing a simulated speed of the agent such that the agent will reach only one inflection point during the current interval of the simulation.

In some embodiments of the third system, the one or more programs are further configured to be executable by one or more of the two or more processors to cause the system to: generate and store data representing a variable associated with both the first node and the second node; increment the variable, by the first processor, without locking the variable and without preventing access to the variable by the second processor; increment the variable, by the second processor, without locking the variable and without preventing access to the variable by the first processor.

In some embodiments of the third system, the one or more programs are executed using a single in-process in-memory database.

In some embodiments, a third method is provided, the third method being for executing a simulation comprising a plurality of agents using multiple processing threads, the third method comprising: at a system comprising two or more processors and storage: grouping a plurality of agents in the simulated environment into a first subset and a second subset, wherein the first subset is associated with a first node of the simulated environment and the second subset is associated with a second node of the simulated environment; assigning the first subset to a first processor of the two or more processors; assigning the second subset to a second processor of the two or more processors; and executing the simulation using a first processing thread associated with the first processor to perform calculations for agents in the first subset and using a second processing thread associated with the second processor to perform calculations for agents in the second subset.

In some embodiments, a third non-transitory computer-readable storage medium is provided, the third non-transitory computer-readable storage medium begin for executing a simulation comprising a plurality of agents using multiple processing threads, wherein the third non-transitory computer-readable storage medium stores instructions that, when executed by a simulation system comprising two or more processors, cause the simulation system to: group a plurality of agents in the simulated environment into a first subset and a second subset, wherein the first subset is associated with a first node of the simulated environment and the second subset is associated with a second node of the simulated environment; assign the first subset to a first processor of the two or more processors; assign the second subset to a second processor of the two or more processors; and execute the simulation using a first processing thread associated with the first processor to perform calculations for agents in the first subset and using a second processing thread associated with the second processor to perform calculations for agents in the second subset.

In some embodiments, any one or more of the characteristics of any one or more of the systems, methods, and/or computer-readable storage mediums recited above may be combined, in whole or in part, with one another and/or with any other features or characteristics described elsewhere herein.

DETAILED DESCRIPTION OF THE INVENTION

Described herein are exemplary embodiments of multi-layer simulation systems and methods that may address the problems and shortcomings of known simulation systems and methods described above.

Figure 1:
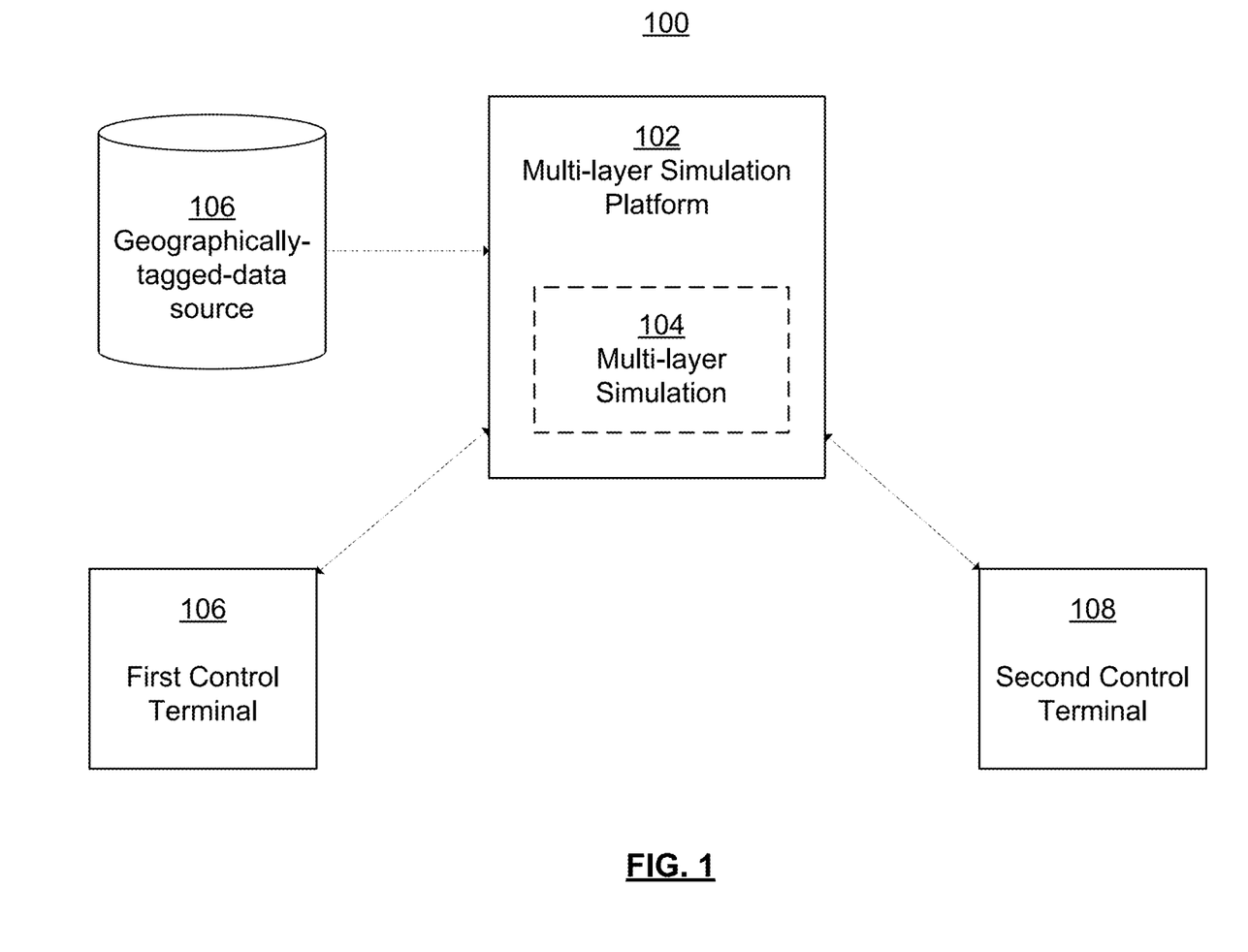
FIG. 1 depicts a multi-layer simulation system, in accordance with some embodiments.

FIG. 1 depicts a multi-layer simulation system 100, in accordance with some embodiments. As shown, system 100 may comprise multi-layer simulation platform 102, geographically-tagged-data source 106, first control terminal 106, and second control terminal 108. Platform 102 may use geographically-tagged data from source 106 to build, store, and execute multi-layer simulation 104, which may be displayed on and/or controlled by inputs received from one or more terminals such as terminals 106 and 108.

In some embodiments, multi-layer simulation platform 102 may comprise any one or more processors, personal computers, super-computers, servers, and/or virtual machines configured to execute instructions stored locally or remotely to build, store, and/or execute multi-layer simulation 104. As described herein, simulation 104 may comprise software stored configured to, when executed by one or more processors, render and display one or more simulations of real-world environments, wherein the simulations comprise a plurality of layers each representing an infrastructure sector. As discussed herein, the layers of simulation 104 may be configured to send and receive data to and from one another in order to simulate the effects that changes to one layer may have on the other layers. As discussed herein, simulation 104 may be executed in accordance with one or more data structures or techniques enabling flat database query times, minimized memory deallocation, and optimized workload allocation across threads, which may enable simulation 104 to operate with improved scalability to include hundreds of thousands or millions of agents in a single simulated environment. In some embodiments, a simulation implementing one or more of the techniques described herein may operate with linear or near-linear (e.g., $f(n) \in O(n)$), as expressed using Big O notation, where n is the number of nodes in the simulation) with respect to the number of nodes in the simulation. Furthermore, a simulation implementing one or more of the techniques described herein may operate with much-better-than-linear scalability with respect to the number of agents in the simulation (for example, doubling the number of agents in the simulation may increase processing times by 20% or less, by 10% or less, or by 5% or less.

In some embodiments, geographically-tagged-data source 106 may comprise any one or more databases, computer systems, file stores, sensors, real-time monitoring devices, and/or user input devices communicatively coupled to platform 102 and configured to store, generate, and/or transmit geographically-tagged data regarding one or more elements of any of the infrastructure sectors represented by layers of simulation 104. Geographically-tagged data transmitted from source 106 to platform 102 may be any data regarding any one or more infrastructure elements of any of the sectors represented by the layers of simulation 104, and it may be associated with geographic metadata indicating a location (e.g., latitude, longitude, altitude) of the one or more infrastructure elements. In some embodiments, the data may comprise data from any suitable public or private database.

Data transmitted from source 106 to platform 102 may additionally comprise information regarding outside factors or stressors that may influence infrastructure elements, such as weather events, climate information, or the like. In some embodiments, data transmitted form source 106 to platform 102 may comprise data that is not geographically-tagged, such as general information about characteristics of one or more infrastructure elements, or such as information about the manners in which one or more infrastructure elements may be expected to interact with one another. A user of system 100 may, in some embodiments, manually associate geographic metadata with data received from source 106, or the user may modify geographic metadata already associated with data received from source 106.

In some embodiments, first control terminal 106 and second control terminal 108 may be control terminals configured to be communicatively coupled with platform 102 and configured to receive data from platform 102 regarding a state of simulation 104, to display a representation or rendering of simulation 104, to detect inputs entered by users of the respective terminal, and to transmit data representing the detected inputs to platform 102. Thus, a user of terminal 106 or 108 may enter an input to the terminal, and data representing the input may be transmitted to platform 102, wherein the data is configured to cause platform 102 to execute one or more changes to simulation 104. The effects of the actions executed against simulation 104, in response to the input entered by the user of the terminal 106 or 108, may then be propagated through the various layers of simulation 104 (e.g., until simulation 104 reaches a new equilibrium state), and data may then be transmitted back from platform 102 to terminals 106 and 108. The data transmitted back from platform 102 to terminals 106 and 108 may be configured to allow display of a representation or rendering of simulation 104 on terminals 106 and/or 108.

In some embodiments, system 100 may be configured to simultaneously display a representation or rendering of multi-layer simulation 104 on both terminals 106 and 108. In some embodiments, platform 102 may accept inputs from one, both, or neither of terminals 106 and 108, while still transmitting data to one or both terminals for display of simulation 104. In some embodiments, control inputs may be accepted only from approved terminals and/or only at approved times; for example, some terminals may be permitted to enter control inputs, while others may be disallowed; some terminals may be in an observer-only state where no inputs may be entered; some terminals may be permitted to enter inputs at any time; and some terminals may be permitted to entire inputs on a turn-based basis by alternating or cycling with one or more other terminals.

In some embodiments, the system may be configured such that multiple terminals may display the same representation, rendering, and/or information about multi-layer simulation 104 at the same time. In some embodiments, the system may be configured such that different terminals may simultaneously display different representations, renderings, and/or information about simulation 104 at the same time. For example, users of different terminals may control the areas and layers of simulation 104 that are displayed on their terminal such that the users at different terminals may simultaneously observe different layers and/or different geographical areas of simulation 104 at the same time.

In some embodiments, running simulation 104 may be more computationally intensive than displaying simulation 104, and platform 102 and terminals 106 and 108 may be configured accordingly. In some embodiments, platform 102 may comprise one or more supercomputers, servers, groups of servers, and/or virtual machines. In some embodiments, different layers of simulation 104 may be run on different servers in communication with one another. In some embodiments, control terminals 106 and/or 108 may be personal computers, laptops, and/or mobile computing devices communicatively coupled with platform 102. In this way, platform 102 may handle the more computationally intensive tasks of building, modifying, and/or rendering simulation 104, while terminals 106 and/or 108 may handle the less computationally intensive tasks of displaying representations, renderings, and/or information about simulation 104 and detecting and transmitting control inputs to platform 102.

In some embodiments, simulation system 100 may share any one or more characteristics in common with one or more simulation systems described in U.S. provisional patent application No. 62/634,949, titled "MULTI-LAYER CYBER-PHYSICAL SYSTEMS SIMULATION PLATFORM," filed Feb. 26, 2018, which is hereby incorporated by reference in its entirety.

In some embodiments, as discussed above, simulation 104 may be a simulation of a large-scale real-world environment such as a city having a population of hundreds of thousands of millions of people. Accordingly, an accurate and usable simulation of the real-world environment may require that simulation 104 includes hundreds of thousands or millions of individual agents. However, known simulation systems and methods allow for only about 40,000 agents in a single simulation, at maximum, because the computational resources required to run the simulation do not scale linearly with the number of agents. Because of the non-linear relationship between computational resources required and number of agents simulated, simulations having more than about 40,000 agents are computationally infeasible using known techniques, even with world-class processing resources.

Thus, discussed herein with reference to FIGS. 1-5 are several new systems and techniques that may improve the scalability of simulations having large numbers of individual agents and thereby allow a simulation such as simulation 104 to simulate hundreds of thousands or millions of agents. Note that the present disclosure discusses simulations having a plurality of "agents"; however, the techniques disclosed herein may also be applicable to simulations having one or more entities, including non-agent entities. That is, the term "agent" as used herein may be understood to refer to agents and/or to entities, and the simulations described herein may comprise one or more agents and one or more entities, including non-agent entities.

Flat Query-Time Databases

In some embodiments, in order to facilitate faster processing times for large-scale simulations, a simulation, such as simulation 104, may be run using one or databases having characteristics selected to optimize (e.g., minimize) query times. In known simulation systems, disk-based databases may have slow query times. Furthermore, in known simulation systems, typical non-flat query databases may also contribute to slow processing times, and they may get even slower as more database entries are added. Thus, using such systems and such databases for simulations with tens of thousands or hundreds of thousands of agents may cause lookup-times to be cripplingly slow when entries regarding characteristics of each agent must be stored in the database.

In some embodiments, lookup times for databases in a simulation system may be improved, for example by an order of magnitude or more, by using one or more in-memory databases instead of disk-based databases because reading from memory may be inherently faster than reading from disk. However, while in-memory databases may be faster than disk-based databases, they may nonetheless require extensive computational resources for serializing and deserializing data to be sent between the in-memory database and the in-memory process (e.g., the process executing the simulation itself).

To address the problem of expending resources on serializing and deserializing data to be sent between the in-memory database and the in-process in-memory process, in some embodiments, a simulation system may leverage one or more in-process databases, such as NOBLIS' SUPERSONIC DB. In some embodiments, a simulation may leverage an in-process database that enables flat (e.g., predetermined) query processing times that are not dependent on the size of the data set being queried. Rather than being dependent on the size of the data set being queried, query processing time for an in-process database may be dependent on one or more of query complexity, an amount of data being returned by a query, and processing power of a processor executing a query.

In some embodiments, a simulation such as simulation 104 may leverage any NoSQL database with a flat query time (e.g., a query time not dependent on database size), such as NOBLIS' SUPERSONIC DB, GOOGLE CLOUD DATASTORE, AMAZON DYNAMODB, MICROSOFT AZURE TABLE STORAGE.

By using one or more databases with flat query times to store data associated with agents of the simulation, scaling processing times as the number of agents in the simulation (and therefore the number of database entries) increases may become essentially linear, rather than increasing by a greater amount of time with the addition of each additional database entry (e.g., each additional simulation agent). In some embodiments, a flat query time enabled by any one or more of the databases discussed herein may be on the order of one millisecond, regardless of the size of the data set being queried.

Time-Interval Data Structures

In some embodiments, in order to facilitate faster processing times for large-scale simulations, a simulation, such as simulation 104, may be run using one or more data structures configured to minimize resources required for memory deallocation during execution of a simulation. As explained below, these data structures may be referred to as time-interval data structures.

In known simulation systems, each agent in the simulated environment is typically represented by a dedicated data structure for a given time interval. When the simulation needs to advance by one interval of simulation unit-time, each of the data structures representing the agents at the previous time interval may be deleted and new data structures representing the agent at the new time interval may be created. For simulations having large numbers of agents and/or many time intervals during execution of the simulation, the result is a large amount of allocated and deallocated memory space as old agents are dropped and new agents are created at each time interval. Thus, in such systems, a large amount of processing time and resources must be expended on memory allocation and deallocation. In instances where garbage collection techniques are being used, excessive allocation and deallocation may cause the garbage collection process to require large amounts of processing resources and/or large amounts of time. Furthermore, excessive memory allocation and deallocation, whether or not garbage collection techniques are being used, causes memory fragmentation and generally leads to performance degradation, such as that caused by inefficient use of memory space.

Figure 2:
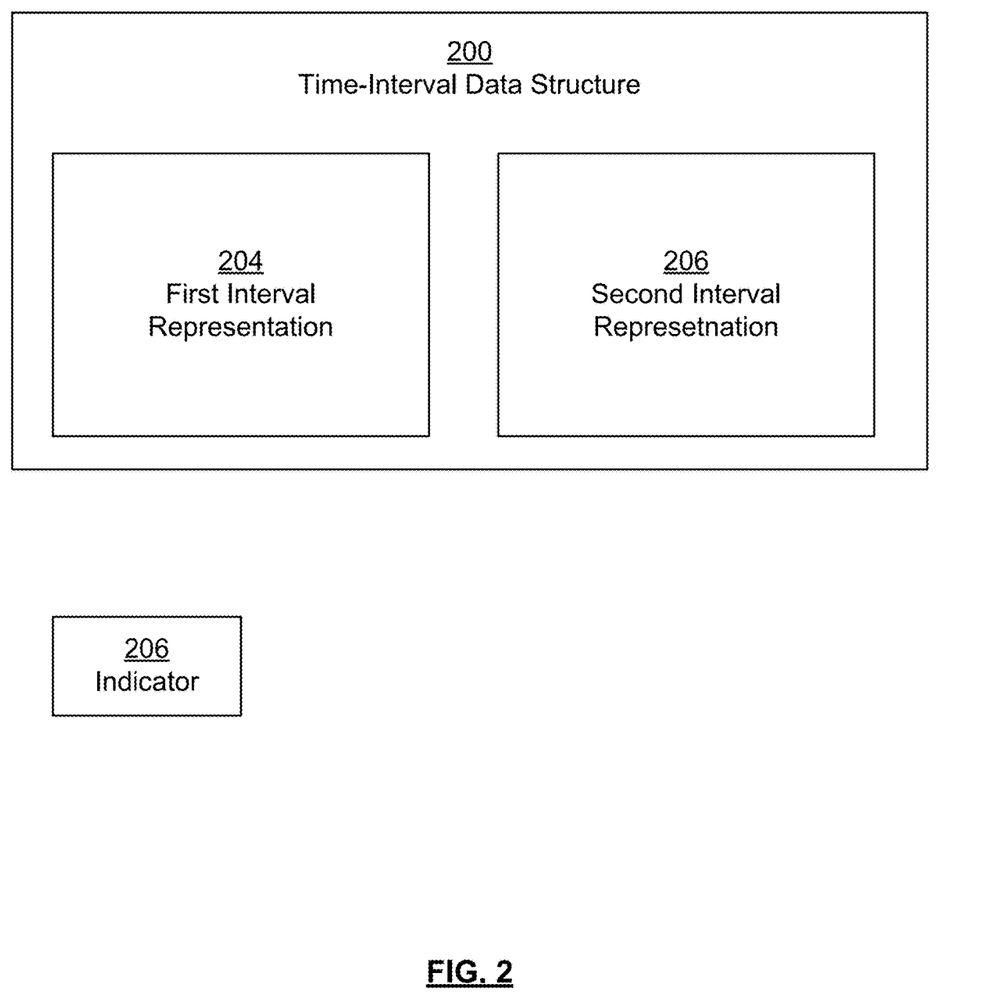
FIG. 2 depicts a time-interval data structure for representing an agent in a simulation, in accordance with some embodiments.

In accordance with the present disclosure, this problem may be addressed via the use of time-interval data structures, such as data structure 200 in FIG. 2. As shown, data structure 200 may comprise first interval representation 202 and second interval representation 204. Also shown in FIG. 2 is indicator 206, which may be a data structure stored in association with, though not necessarily as a part of, data structure 200. As explained herein, data structure 200 may be a single data structure, representing an agent in a simulation at two different intervals in simulation-time. That is, a first portion of data structure 200 may represent characteristics of an agent during a first interval of simulation time, and a second portion of data structure 200 may represent characteristics of the agent during a second (e.g., subsequent or prior) interval of simulation time.

In some embodiments, the relationship of first interval representation 202 and second interval representation 204 to one another may be indicated and/or defined by indicator 206, which in some embodiments may be a flag that may be configured by a user and/or system to selectively indicate one of the two representations (202 and 204) as a current interval and the other of the two representations as a next interval. Put another way, one of the two representations may represent interval N, while the other may represent interval N+1, and indicator 206 may indicate which representation represents which interval.

In some embodiments, indicator 206 may be stored in association with data structure 200, such as by being stored on the same storage medium and/or as part of the same simulation system. In some embodiments, indicator 206 may be stored in association with a plurality of data structures other than data structure 200, such that a plurality of agents may all correspond to indicator 206, and the plurality of agents may all be configured (e.g., flipped or reversed, as discussed herein) in accordance with indicator 206. In some embodiments, a simulation may comprise a single indicator (e.g., indicator 206) that applies to all agents in the simulation, or may comprise one or more indicators that apply to a respective subset of agents in the system (e.g., one indicator per layer in a multi-layer simulation; or one indicator for a subset of agents iterating at a first rate and a second indicator for a subset of agents iterating at a second rate, such as twice as fast as the first rate). In some alternate embodiments, an indicator such as indicator 206 may be stored as part of a data structure representing an individual agent.

In some embodiments, data structure 200 may be configured such that the representation representing interval N is in a read-only state, and/or such that the representation representing interval N+1 is in a write-only state. In this way, when the simulation needs to read data from the agent represented by data structure 200 (e.g., another agent or layer of the simulation is effected in some way by a characteristic of the agent represented by data structure 200), the data may be read from whichever representation is designated as representing interval N. On the other hand, when the simulation needs to write data to the agent represented by data structure 200 (e.g., a characteristic of the agent represented by data structure 200 is effected or changed in some way by another agent or layer of the simulation), then data may be written to whichever representation is designated as representing interval N+1. In this way, reading operations may never conflict with writing operations, and one may never have to wait for the other to be completed in order to proceed, as each of the operations may always be performed on a different portion of data structure 200.

In some embodiments, when all operations for a present interval of a simulation have been completed, then indicator 206 may be reconfigured or "flipped" to change the indication for one of the representations (202 and 204) from N to N+1 and the other from N+1 to N. (As discussed further below, a once-per-interval copy of the updated data written to the N+1 representation to the N representation may also be performed along with flipping or indicator 206.) The simulation may then iterate to the next interval of simulation time.

In this way, memory deallocation and garbage collection requirements may be reduced because a data structure representing an agent in the simulation is not deleted and discarded as the simulation advances to a next interval of simulation time; rather, data structures such as data structure 200 may simply be updated by the flipping of indicator 206 at each advancement of simulation time, and the entire data structure therefore need not be deleted and memory need not be deallocated accordingly. This data structure, including as used below with respect to method 300 in FIG. 3, may reduce the need for computational resources to be expended on memory deallocation operations in large-scale simulations, and may therefore help enable simulations having hundreds of thousands or millions of agents.

Figure 3:
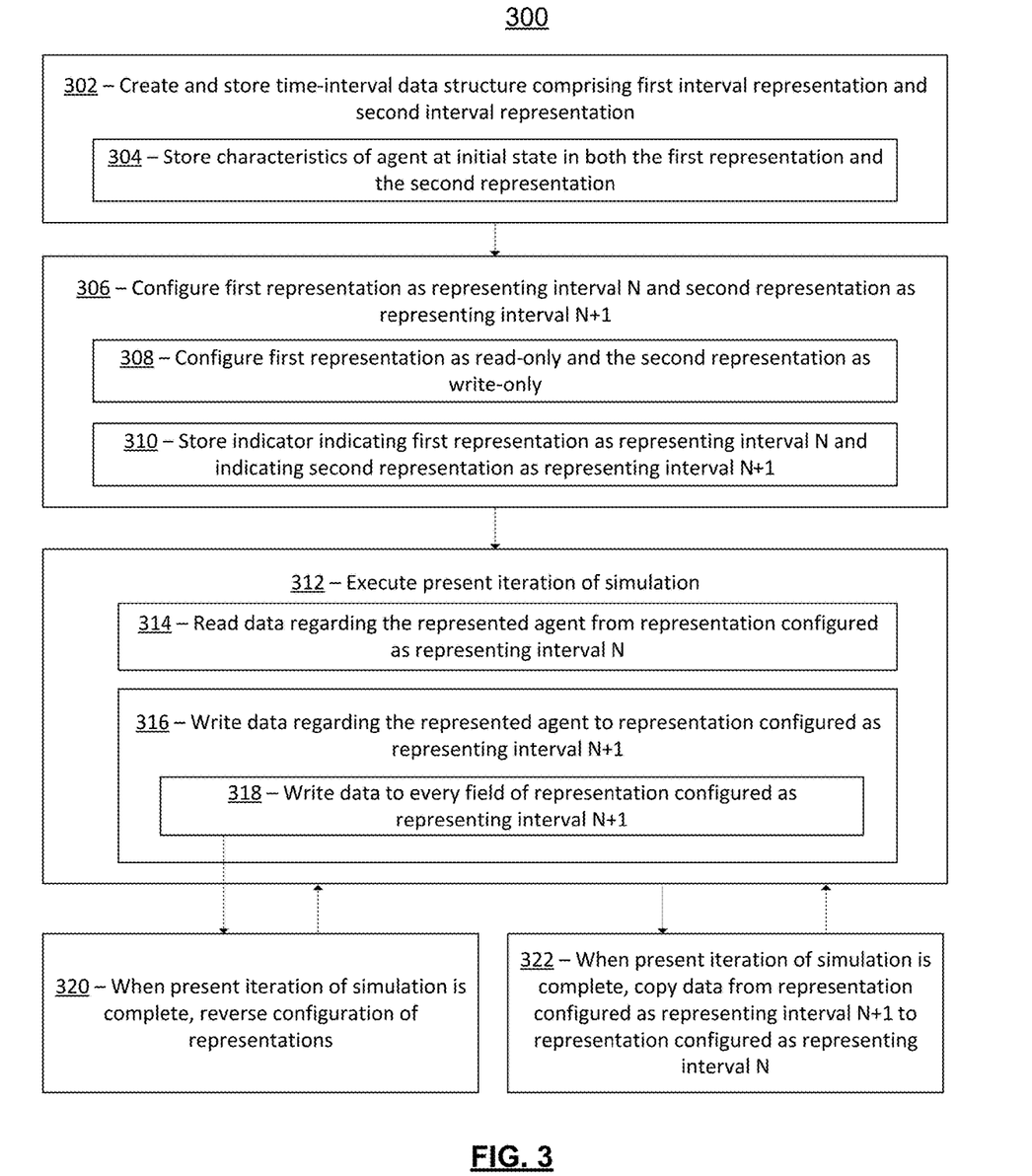
FIG. 3 is a flowchart depicting a method for executing a simulation in accordance with a time-interval data structure, in accordance with some embodiments.

FIG. 3 is a flowchart depicting a method 300 for executing a simulation in accordance with a time-interval data structure, such as data structure 200. In some embodiments, method 300 may be executed by a system such as system 100.

At block 302, the system may create and store a time-interval data structure comprising a first interval representation and a second interval representation. In some embodiments, the time-interval data structure may represent an individual agent in a simulation, and may share any one or more characteristics with data structure 200 discussed above. In the example of data-structure 200, the data structure may comprise first interval representation 202 and second interval representation 204. In some embodiments, time-interval data structure may represent any one or more static and/or dynamic aspects or characteristics of the agent represented by the data structure; in some embodiments, dynamic aspect or characteristics of the agent that may change over time in the simulation (e.g., geographical position, speed, or intensity of one or more characteristics) may be stored in the first interval representation and/or the second interval representation.

In some embodiments, the data structure may be stored on any suitable storage medium associated with the system running the simulation, including on memory and/or as part of a flat query-time in-memory and/or in-process database.

At block 304, in some embodiments, creating and storing the time-interval data structure may comprise storing characteristics of the represented agent at an initial state in the simulation in both the first representation and the second representation. That is, an initial state of the agent at the beginning of simulation time may be represented in both the first representation and the second representation; in this manner, each of the two separate portions of the data structure may initially mirror one another by both reflecting the same initial state of the agent in the simulation.

At block 306, in some embodiments, the system may configure the first representation as representing interval N and may configure the second representation as representing interval N+1. It should be noted that, in some embodiments, each of the two representations in the data structure may indicate identical characteristics of the represented agent at the beginning of a simulation and/or the beginning of an interval of the simulation, so it may be immaterial as to which of the two representations is configured as representing interval N and which is configured as representing interval N+1. In some embodiments, the representation configured to represent interval N may be to have data read from it during execution of the simulation, while the representation configured to represent interval N+1 may be configured to have new data written to it during execution of the simulation.

At block 308, in some embodiments, configuring the representations as respectively representing intervals N and N+1 may comprise configuring the first representation as read-only and configuring the second representation as write-only.

In some embodiments, read-only data may be configured such that one or more processors of the system executing the system may be prohibited from deleting, overwriting, or modifying the data, while they may be permitted to query or read the data. In some embodiments, the memory space associated with the representation associated with interval N may be configured such that new data may not be written to it, deleted from it, or modified within it. In this way, one or more processors executing the simulation may be able to query the interval-N representation in order to read data about the state of the agent, but may not be permitted to write any new or modified data to the interval-N representation.

In some embodiments, write-only data may be configured such that one or more processors of the system executing the system may be permitted to delete, overwrite, or modify the data, while they may be prohibited from querying or reading the data. In some embodiments, the memory space associated with the representation associated with interval N+1 may be configured such that new data may be written to it, deleted from it, and/or modified within it. In this way, one or more processors executing the simulation may be unable to query the interval-N+1 representation in order to read data about the state of the agent, but may be permitted to write any new or modified data to the interval-N+1 representation.

As discussed above, configuring one portion of the data structure for data reading and another portion of the data structure for data writing may, in some embodiments, prevent conflicts between writing operating and reading operations from occurring when multiple servers or processors executing a simulation need to read from and write to a single agent at the same point in time. Rather than having to perform the operations in succession, which may cause increased processing time, the operations may instead be performed simultaneously. Furthermore, configuring one portion of the data structure for data reading and another portion of the data structure for data writing may, in some embodiments, prevent infinite feedback loops between different agents in a simulation, which may help to enable executing multi-layer simulations.

At block 310, in some embodiments, configuring the representations as respectively representing intervals N and N+1 may comprise storing an indicator indicating that the first representation represents interval N and that the second representation represents interval N+1. In some embodiments, the stored indicator may be a flag or other data structure that may be stored in associate with the data structure representing the agent. In some embodiments, the stored indicator may be a pointer that indicates one or more portions of the data structure. In some embodiments, the stored indicator may be stored separately from the data structure representing the agent, while in some embodiments the stored indicator may be stored as part of the data structure representing the agent. In some embodiments, the system may be configured such that one or more of the characteristics of the first and second representation may be automatically configured and/or configured by the system in accordance with the stored indicator; in this way, modifying the indicator (e.g., flipping a flag to point to one representation or the other) may in some embodiments automatically cause the representations to be reconfigured (such as by reversing roles between intervals, as discussed below). In the example of FIG. 2, the stored indicator may be indicator 206.

At block 312, in some embodiments, the system may execute a present interval of a simulation. In some embodiments, the present interval may be an initial interval of a simulation or a subsequent interval. In some embodiments, the present interval of the simulation may be interval N. In some embodiments, the interval being executed by the simulation may cover the simulation-time period for which the characteristics of the agent represented by the data structure are those characteristics stored in the read-only interval-N representation.

At block 314, in some embodiments, executing the present interval of the simulation may comprise reading data regarding the represented agent from the representation configured as representing interval N. As discussed above, the interval-N representation may be configured to serve as a representation from which data may be read by one or more servers or processors during execution of the simulation. Accordingly, a plurality of threads may, in some embodiments, read data regarding characteristics of the represented agent from the interval-N representation during execution of the interval-N. For example, when another agent in the simulation interacts during the present interval with the represented agent in such a way that the simulation needs to read one or more characteristics of the represented agent in order to determine what effect the represented agent may have on the other agent, then the system may read data regarding the one or more characteristics from the interval-N representation. It should be noted that, in some embodiments, the data stored in the interval-N representation may not change throughout the execution of the current interval of the simulation.

At block 316, in some embodiments, executing the present interval of the simulation may comprise writing data regarding the represented agent to the representation configured as representing interval N+1.

As discussed above, the interval-N+1 representation may be configured to serve as a representation to which data may be written by one or more threads during execution of the simulation. Accordingly, a thread may, in some embodiments, write data regarding characteristics of the represented agent to the interval-N+1 representation during execution of interval-N. For example, when another agent in the simulation interacts during the present interval with the represented agent in such a way that the simulation determines that a characteristic of the represented agent is changed, added, or adjusted, then the system may write data regarding the one or more changed, added, or adjusted characteristics to the interval-N+1 representation. In this way, in some embodiments, while data stored in the interval-N representation may not change throughout the execution of the current interval of the simulation, updates to characteristics of the represented agent may be written to and stored in the interval-N+1 representation, such that those updated characteristics may serve as a baseline for the status of the agent during a subsequent interval of the simulation.

At block 318, in some embodiments, writing data regarding the represented agent to the representation configured as representing interval N+1 may comprise writing data to every field of the representation configured as representing interval N+1. In some embodiments, the representation configured to be written to may comprise a plurality of data fields, such as a plurality of fields each representing a characteristic of the represented entity (e.g., speed, velocity, position, acceleration, etc.). In some embodiments, a simulation may write to only certain fields of a representation during one iteration of the simulation, for example by only writing to those fields for which a value is changed (or newly established) during the iteration. However, in some embodiments, such as those referred to by block 318, a system may write data to every field of a representation during an interval of a simulation. In some embodiments, a simulation may be configured such that data is written to every write-to field of every representation during every iteration/interval of a simulation, even if the represented value or characteristic did not change during the iteration. As discussed in further detail below, writing data to every field of a representation may allow representations to be "flipped" or reversed without the need to manually copy data from one representation to the other, which may enable reducing memory allocation and deallocation needs.

At block 320, in some embodiments, the system may reverse the configuration of the two representations. In some embodiments, the first representation may be reconfigured in the manner in which the second configuration was initially/previously configured, and the second representation may be reconfigured in the manner in which the first configuration was initially/previously configured. In some embodiments, reversing the configuration of the two representations may comprise configuring a representation previously configured to be used for data reading (e.g., as read-only) to instead be used for data writing (e.g., as write-only), and vice versa. In some embodiments, reversing the configuration of the two representations may involve replacing and/or modifying the stored indicator referenced above (e.g., indicator 206). In some embodiments, where the stored indicator is a flag, the flag may be flipped to indicate that the representation previously associated with reading data may now be associated with writing data, and so forth. Furthermore, in some embodiments, for the subsequent interval of the simulation, the representation previously associated with the future (previously "N+1") interval may now be associated with the present interval (now "N"), whereas the representation previously associated with the present interval (previously "N") may now be associated with a future interval (now "N+1").

As mentioned above, in some embodiments, a system may be configured to reverse configurations of two representations (as explained with respect to block 320) following or at the conclusion of execution of a simulation interval in which data is written to every field of the write-only configuration being reverse (as explained above with respect to block 318). As shown by the arrow from block 318 to block 320 in FIG. 3, block 320 may in some embodiments follow from execution of block 318. By ensuring that every field of a representation is written to during each interval of execution of a simulation, whether or not the characteristic represented by the field changes during the interval, the system may ensure that the write-to representation (e.g., the representation previously associated with a future interval) is fully up-to-date when it is reconfigured to represent the new present interval and to be read from. In this way, data that is read from the reconfigured representation during future intervals/iterations may be ensured to be fully up-to-date and accurate.

Following block 320, in some embodiments, method 300 may return to block 312 and the simulation may continue to be iteratively executed, one interval after another. After each interval, in accordance with step 320 of method 300, the designation of the representations may be flipped for the following interval. In this way, the same memory space may be used in turn for reading data regarding the agent, then writing new data regarding the same agent, then reading that new data regarding the agent, then writing newer data, and so on. Thus, rather than generating new data objects to represent an agent at each interval of the simulation, a single, two-part data object may be used to represent the agent for an unlimited number of intervals. Because old data objects from previous intervals need not be discarded, and because existing representations in the single data object may instead simply be repurposed and reconfigured, memory deallocation operations and the problem of unwieldy and resource-intensive garbage collection may be thereby be addressed. In some embodiments, method 300 may accordingly contribute to enabling a simulation to quickly, accurately, and efficiently operate with hundreds of thousands or millions of individual agents, a plurality of which may be represented by data objects in accordance with method 300 (and/or other techniques discussed elsewhere herein).

Attention is now directed to block 322, which in some embodiments may follow from block 312 (including blocks 314-318) as an alternate to block 320. At block 322, in some embodiments, when the present interval of the simulation is complete, the system may copy data from the representation configured as representing interval N+1 to the representation configured as representing interval N. In this manner, the updated characteristics of the represented agent reflected in the data stored in the interval-N+1 representation may be copied to the interval-N representation, such that both representations may represent the same updated characteristics in advance of the beginning of the subsequent interval of the simulation.

By copying data from the interval-N+1 representation to the interval-N representation, the two representations may be synchronized following each iteration of the simulation, and any need to reverse the configuration of the representations (as explained above with respect to block 320) may be obviated. Thus, as shown by the arrow from block 312 to block 322, block 322 may follow, in some embodiments, from block 312 without regard for whether data was written to every field of the interval-N+1 write-to representation. By copying all data from the write-to (interval N+1) representation to the read-from (interval-N) representation following the iteration, the data in each representation may be synchronized before the simulation advances to the next iteration, thereby ensuring that data read from the read-from (interval-N) representation during next iteration is fully up-to-date and accurate.

Following block 322, in some embodiments, method 300 may return to block 312 and the simulation may continue to be iteratively executed, one interval after another. After each interval, in accordance with method 300, the updated data from the write-only representation may be copied to the read-only representation. In this way, the same memory space may be used during each interval for writing new data regarding the agent and reading previous data regarding the same agent. Thus, rather than generating new data objects to represent an agent at each interval of the simulation, a single, two-part data object may be used to represent the agent for an unlimited number of intervals. Because old data objects from previous intervals need not be discarded, and because existing representations in the single data object may instead simply be reused, memory deallocation operations and the problem of unwieldy and resource-intensive garbage collection may be thereby be addressed. In some embodiments, method 300 may accordingly contribute to enabling a simulation to quickly, accurately, and efficiently operate with hundreds of thousands or millions of individual agents, a plurality of which may be represented by data objects in accordance with method 300 (and/or other techniques discussed elsewhere herein).

Node-Based Allocation of Processing Resources

In some embodiments, in order to facilitate faster processing times for large-scale simulations, a simulation, such as simulation 104, may be run using node-based allocation of processing resources. By allocating processing resources on a per-node basis rather than on a per-agent basis, speed and efficiency of a simulation may be improved.

For example, in known simulation techniques, calculations may be performed on a per-agent basis, which leads to problems of thread contention when multiple processors or servers or threads are simultaneously attempting to write to a single object, such as a single representation of an agent in the simulation. In known simulation techniques, a single thread that is writing to an object may lock out all other threads while it is operating on the object, and may require all other threads to queue and wait until the current writing operation is complete before any other thread can begin its writing operation. When threads are queuing and waiting for a locked object to become available, this introduces inefficiencies to a simulation system.

Furthermore, the problem of thread contention is one that, in known simulation platforms, cannot be effectively addressed by increasing processing power; this is because the introduction of additional processors (e.g., more threads, more servers, more cores) in parallel may increase the number of possible collisions between threads and may increase the time lost to thread contention. Accordingly, doubling the number of cores may fall short of halving the processing time required to execute the simulation; quadrupling the number of cores may fall even shorter, proportionally, of quartering the processing time. Put another way, thread contention may cause known simulation platforms to fail to scale linearly as additional processing resources are added.

Figure 4:
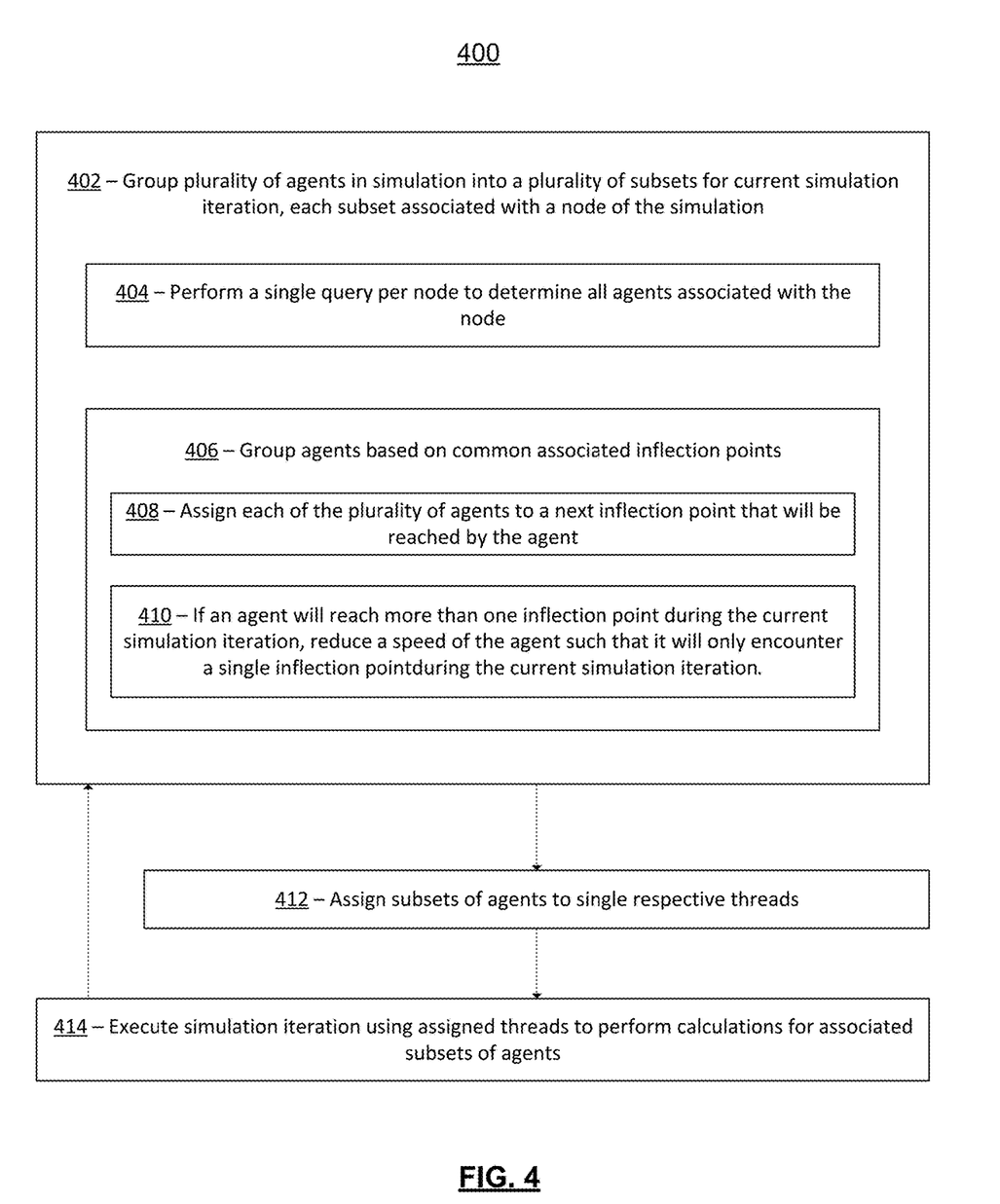
FIG. 4 is a flowchart depicting a method for node-based allocation of processing resources for executing a simulation, in accordance with some embodiments.

The solutions described herein, including the solution regarding node-based allocation of processing resources discussed below with further reference to method 400, may help to address the problems of known simulation platforms discussed above. In some embodiments, node-based allocation of processing resources may entail grouping agents in a simulation into a plurality of subsets based on a common associated node, and then allocating processing resources such that a single processor/thread is assigned to a subset of grouped agents. Because it is unlikely or impossible, in some embodiments, that any given agent will interact with any agents not associated with the same node as the given agent, then allocating processing resources based on shared nodes may ensure that threads do not collide with one another and cause delays and computational inefficiencies due to thread contention. In some embodiments, node-based allocation of processing resources as described herein may allow for linear scalability of processing times to be achieved as additional threads/cores/processors are added. Thus, doubling the number of cores may halve processing time, and quadrupling the number of cores may quarter processing time.

FIG. 4 is a flowchart depicting method 400 for node-based allocation of processing resources for executing a simulation, in accordance with some embodiments. In some embodiments, method 400 may be performed by any one or more of the simulation systems discussed herein, including system 100. The simulation in method 400 may in some embodiments be simulation 104. In some embodiments, all or part of method 400 may be combined with all or part of other simulation techniques and methods discussed herein.

At block 402, in some embodiments, the system groups a plurality of agents in a simulated environment into a plurality of subsets, each subset associated with a node of the simulation. In some embodiments, grouping the agents into subsets may comprise storing one or more indicators of the subset into which the agent is grouped; in some embodiments, a grouping indicator may be stored as part of a data structure representing the agent, or may be stored separately from one or more data structures representing agents.

In some embodiments, all agents in a simulated environment may be grouped in this manner and/or in another manner; in some embodiments, a portion of all agents in a simulated environment may be grouped in this manner and/or in another manner. In some embodiments, each grouped agent may be assigned to only a single subset, such that interaction of agents across different subsets may be minimized, as discussed below.

At block 404, in some embodiments, grouping the plurality of agents into a plurality of subsets comprises running a single query per node of the simulation. In some embodiments, grouping the plurality of agents into a plurality of subsets comprises running a single query per subset into which the agents are being grouped. For example, rather than running a query for each agent to determine which node it is associated with and/or which subset it should be grouped into, a single query may be run for each node and/or each subset to determine all agents that should be associated with the node or subset. In some embodiments, such as when using a flat-query time database, this may drastically speed up processing time because all agents associated with a node/subset may be determined in a single flat-query time of the database, rather than needing to expend the same flat query time for each of a plurality of dedicated queries for each agent.

At block 406, in some embodiments, grouping the plurality of agents into a plurality of subsets comprises grouping agents based on common associated inflection points in the simulated environment. In some embodiments, the nodes of the simulation associated with each subset may be inflection points in a simulated environment. An inflection point may be any feature of a simulated environment from which an agent in the simulation may proceed in more than one manner; for example, an intersection in a traffic simulation (e.g., a traffic layer of a multi-layer simulation) may be an inflection point, as agents representing vehicles may proceed from the intersection along more than one possible path (e.g., continue straight, turn right, turn left, U-turn, etc.). In some embodiments, agents may be assigned to inflection points that are nearest to them, that they recently interacted with, or that the system determines they are likely to interact with in the future.

In some embodiments, alternately or additionally to grouping agents based on common inflection points, agents may be grouped based on one or more other common features, such as a common node that is not an inflection point. For example, in simulations of one or more CPS layers besides traffic/transportation, nodes may be associated with one or more agents or other discrete objects in the simulation, and may be used to group the agents or other discrete objects into a plurality of subsets. In general, in some embodiments, subsets may be selected such that agents or discrete objects in the same subset are more likely to affect and/or be affected by one another than to affect and/or be affected by agents or discrete objects in a different subset.

At block 408, in some embodiments, grouping agents based on common associated inflection points comprises assigning each of the plurality of agents to a next inflection point that will be reached by the agent during the current simulation interval. In some embodiments, by assigning each agent to a next inflection point that each agent is projected to reach, then each agent may be guaranteed to be associated with and assigned to only one inflection point. In the example of a transportation simulation, agents representing vehicles may be assigned to an inflection point associated with the next intersection that the vehicle will reach during the current simulation interval; thus, if a vehicle is currently on a segment of roadway and headed in a direction toward a next intersection, then the agent representing the vehicle may be assigned to the subset associated with the next intersection.

In some embodiments, if an agent is not projected to reach any inflection points during the current interval of the simulation, then the agent may not be assigned to any subset. For example, if a simulated vehicle in a transportation simulation is on a long stretch of highway such that the vehicle will not encounter any exit opportunities during the current interval (e.g., during one simulation unit-time), then the agent representing the vehicle may not be assigned to any subset. In some embodiments, agents not projected to reach any inflection points during a current interval of a simulation may be assigned to a subset associated with a next inflection point that they are projected to reach, even if they will not reach the inflection point during the current interval of the simulation. In some embodiments, agents not projected to reach any inflection points during a current interval of a simulation may be assigned to subsets with nearby agents, with nearby inflection points, and/or with other agents not projected to reach any inflection points during a current interval of a simulation.

At block 410, in some embodiments, grouping agents based on common associated inflection points comprises, if the system determines that an agent will reach more than one inflection point during the current simulation interval, reducing a speed of the agent such that it will only encounter a single inflection point during the current simulation interval. For example, if a vehicle in a transportation simulation is projected to reach not just one but two or more intersections during a single interval of the simulation, then the system may modify (e.g., reduce) a speed of the vehicle in the simulation as needed such that the vehicle will only reach a single intersection during a single unit-time of the simulation. In some embodiments, this correction may be useful in dense urban environments where intersections are located particularly close to one another.

At block 412, in some embodiments, the system may assign subsets of agents to single respective threads. In some embodiments, each subset of agents may be assigned to a single processing thread (e.g., processor, server, core), such that calculations for each of the agents associated in the respective subset will be executed by the associated processing thread.

At block 414, in some embodiments, the system may execute the simulation interval using the assigned threads to perform calculations for associated subsets of agents. That is, calculations for each of the agents associated in the respective subset may be executed by the associated processing thread.

By performing all calculations and operations for agents associated with a common inflection point by the same thread, the risk of thread contention may be greatly reduced or eliminated. For example, in simulations where agents that are nearby one another or associated with similar inflection points are more likely to affect and be affected by one another, performing all operations and calculations for agents associated with a common inflection point by the same thread may prevent (or greatly reduce the frequency with which) multiple different threads attempt to read from or write to a single agent at the same time. Thus, if the frequency with which multiple different threads attempt to access a single agent at the same time is reduced (or if occurrences are eliminated entirely), the amount of time that one or more threads spends inactive while locked out of an agent may be greatly reduced or eliminated. Accordingly, the problem of thread contention may be reduced or eliminated, and the overall speed and efficiency of the simulation may be greatly increased.

In some embodiments, as mentioned above, using node-based allocation of processing resources explained herein may enable linear scalability of processing efficiency as additional processing cores are added, because thread contention may be eliminated and each new processing core added to the simulation system may be utilized at 100% efficiency. In some embodiments, such as when node-based allocation of processing resources is combined with use of a flat query-time database as discussed above, node-based allocation of processing resources may enable a database having a flat per-node query time on the order of 1 millisecond, achieving linear scalability (e.g., $0(n)$) per-node and better-than-linear scalability per-agent. In some embodiments, this may help to enable efficiently and accurately running simulations having hundreds of thousands or millions of separate agents.

Atomic Incrementing and Decrementing of Variables

In some embodiments, in order to facilitate faster processing times for large-scale simulations, a simulation, such as simulation 104, may be run using atomic increment and/or atomic decrement operations. Atomic increment/decrement operations may enable variables in the simulation to be incremented and/or decremented by multiple processing cores without locking the variable. For example, atomic increment and decrement operations may include atomic interlock operations in C#, as one example. By using atomic increment/decrement operations to avoid the need to lock variables, delays in processing time due to thread contention may be avoided, as parallel processing cores may not lock one another out of a variable.

In some embodiments, executing a simulation may comprise calculating one or more variables that may be affected by agents assigned to different processing threads. In these embodiments, using atomic increment/decrement operations may be advantageous. For example, as discussed above, a simulation may in some embodiments be run using node-based allocation of processing resources, such that agents may be sorted into groups associated with certain nodes of the simulation; as explained above, sorting agents into node-based groups may help to reduce and/or eliminate thread contention because agents not associated with a same node may seldom or never interact with one another during execution of the simulation. However, even when node-based allocation of processing resources is used, a simulation may nonetheless comprise calculating one or more variables that may be affected by agents assigned to different processing cores/threads.

For example, in a transportation/traffic simulation, the simulation may be configured to calculate a traffic density of roadway segments located between inflection-point nodes (e.g., the segment of roadway between any two intersections or other nodes). Calculating the traffic density on a segment of roadway between two inflection points may involve increasing the traffic density whenever a vehicle crosses the upstream inflection point to enter the segment and decreasing the traffic density whenever a vehicle crosses the downstream inflection point to exit the segment; the former may be done by a first processing thread associated with the upstream node, and the latter may be done by a second processing thread associated with the downstream node. Thus, two different processing threads may each be configured to operate on a single variable, which may create issues of thread contention even in simulations using node-based allocation of processing resources.

More generally, any layer of a simulation (e.g., any one or more layers of a CPS simulation) may be configured, in some embodiments, such that one or more variables regarding an inter-node link may be operated upon by separate node-associated processing threads. More generally, in some embodiments, any one or more variables in any layer of a simulation may be configured to be operated on by multiple different processing threads, whether or not the variable is associated with an inter-node link and whether or not the multiple different processing threads are associated with specific nodes. As with the specific case of inter-inflection-point roadway segments in a traffic simulation discussed above, these situations may create issues of thread contention that slow processing times and degrade performance.

In any of the situations discussed above, a simulation may address the issue of thread contention by using atomic increment/decrement operations (e.g., atomic interlock in C#) to allow variables to be operated on by multiple different threads at once, without locking the variables while doing so. By using atomic increment/decrement operations to operate on certain variables in a simulation, such as inter-node link variables (e.g., traffic density on a roadway segment between intersections) such that they may be operated upon without being locked, thread contention may be further reduced or eliminated and the processing efficiency and speed of the simulation may be improved.

Computing Components

Figure 5:
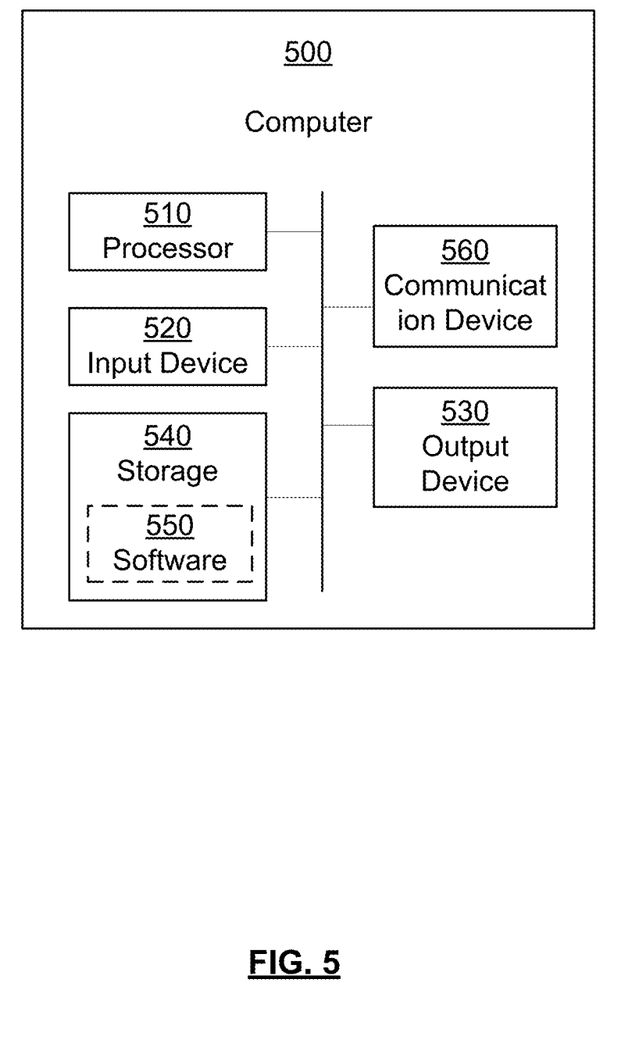
FIG. 5 depicts a computer, in accordance with some embodiments.

FIG. 5 illustrates a computer, in accordance with some embodiments. Computer 500 can be a component of a system for providing simulations, such as CPS simulations, such as system 100 and/or any of its subcomponents described above with respect to FIG. 1. In some embodiments, computer 500 may be configured to execute a method for providing, creating, and/or executing a simulation in accordance with one or more time-interval data structures, such as all or part of method 300 of FIG. 3. In some embodiments, computer 500 may be configured to execute a method for providing, creating, and/or executing a simulation in accordance with one or techniques for node-based allocation of processing resources, such as all or part of method 400 of FIG. 4. In some embodiments, computer 500 may be configured to execute any of the other techniques discussed herein, alone and/or in combination with one another and/or with methods 300 and/or 400.

Computer 500 can be a host computer connected to a network. Computer 500 can be a client computer or a server. As shown in FIG. 5, computer 500 can be any suitable type of microprocessor-based device, such as a personal computer; workstation; server; or handheld computing device, such as a phone or tablet. The computer can include, for example, one or more of processor 510, input device 520, output device 530, storage 540, and communication device 560.

Input device 520 can be any suitable device that provides input, such as a touch screen or monitor, keyboard, mouse, or voice-recognition device. Output device 530 can be any suitable device that provides output, such as a touch screen, monitor, printer, disk drive, or speaker.

Storage 540 can be any suitable device that provides storage, such as an electrical, magnetic, or optical memory, including a RAM, cache, hard drive, CD-ROM drive, tape drive, or removable storage disk. Communication device 560 can include any suitable device capable of transmitting and receiving signals over a network, such as a network interface chip or card. The components of the computer can be connected in any suitable manner, such as via a physical bus or wirelessly. Storage 540 can be a non-transitory computer-readable storage medium comprising one or more programs, which, when executed by one or more processors, such as processor 510, cause the one or more processors to execute methods described herein, such as all or part of methods 300 or 400 described with respect to FIGS. 3 and 4, respectively.

Software 550, which can be stored in storage 540 and executed by processor 510, can include, for example, the programming that embodies the functionality of the present disclosure (e.g., as embodied in the systems, computers, servers, and/or devices as described above). In some embodiments, software 550 can be implemented and executed on a combination of servers such as application servers and database servers.

Software 550 can also be stored and/or transported within any computer-readable storage medium for use by or in connection with an instruction execution system, apparatus, or device, such as those described above, that can fetch and execute instructions associated with the software from the instruction execution system, apparatus, or device. In the context of this disclosure, a computer-readable storage medium can be any medium, such as storage 540, that can contain or store programming for use by or in connection with an instruction execution system, apparatus, or device.

Software 550 can also be propagated within any transport medium for use by or in connection with an instruction execution system, apparatus, or device, such as those described above, that can fetch and execute instructions associated with the software from the instruction execution system, apparatus, or device. In the context of this disclosure, a transport medium can be any medium that can communicate, propagate, or transport programming for use by or in connection with an instruction execution system, apparatus, or device. The transport-readable medium can include, but is not limited to, an electronic, magnetic, optical, electromagnetic, or infrared wired or wireless propagation medium.

Computer 500 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Computer 500 can implement any operating system suitable for operating on the network. Software 550 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims. Finally, the entire disclosure of the patents and publications referred to in this application are hereby incorporated herein by reference.

The invention claimed is:

1. A system for executing a simulation comprising a plurality of agents using multiple processing threads, comprising:
    two or more processors;
    memory storing one or more programs, wherein the one or more programs are configured to be executable by one or more of the two or more processors to cause the system to:
        group a plurality of agents in the simulated environment into a first subset and a second subset, wherein the first subset is associated with a first node of the simulated environment and the second subset is associated with a second node of the simulated environment;
        assign the first subset to a first processor of the two or more processors;
        assign the second subset to a second processor of the two or more processors; and
        execute the simulation using a first processing thread associated with the first processor to perform calculations for agents in the first subset and using a second processing thread associated with the second processor to perform calculations for agents in the second subset.

2. The system of claim 1, wherein grouping the plurality of agents into the first subset and the second subset comprises:
    performing a first query to identify all agents associated with the first node to be grouped into the first subset; and
    performing a second query to identify all agents associated with the second node to be grouped into the second subset.

3. The system of claim 2, wherein the first query and the second query are performed against a flat-query-time database.

4. The system of claim 1, wherein:
    the first node is a first inflection point in the simulated environment;
    the second node is a second inflection point in the simulated environment; and
    grouping the plurality of agents into the first subset and the second subset comprises grouping agents associated with the first inflection point into the first subset and grouping agents associated with the second inflection point into the second subset.

5. The system of claim 4, wherein the one or more programs are further configured to be executable by one or more of the two or more processors to cause the system to:
    if the system determines that an agent will reach the first inflection point during a current interval of the simulation, determine that the agent is associated with the first inflection point; and
    if the system determines that the agent will reach the second inflection point during the current interval of the simulation, determine that the agent is associated with the second inflection point.

6. The system of claim 4, wherein the one or more programs are further configured to be executable by one or more of the two or more processors to cause the system to:
    if the system determines that an agent will reach more than one inflection point during a current interval of the simulation, reduce a simulated speed of the agent such that the agent will reach only one inflection point during the current interval of the simulation.

7. The system of claim 1, wherein the one or more programs are further configured to be executable by one or more of the two or more processors to cause the system to:
    generate and store data representing a variable associated with both the first node and the second node;
    increment the variable, by the first processor, without locking the variable and without preventing access to the variable by the second processor;
    increment the variable, by the second processor, without locking the variable and without preventing access to the variable by the first processor.

8. The system of claim 1, wherein the one or more programs are executed using a single in-process in-memory database.

9. A method for executing a simulation comprising a plurality of agents using multiple processing threads, comprising:
    at a system comprising two or more processors and storage:
        grouping a plurality of agents in the simulated environment into a first subset and a second subset, wherein the first subset is associated with a first node of the simulated environment and the second subset is associated with a second node of the simulated environment;
        assigning the first subset to a first processor of the two or more processors;
        assigning the second subset to a second processor of the two or more processors; and
        executing the simulation using a first processing thread associated with the first processor to perform calculations for agents in the first subset and using a second processing thread associated with the second processor to perform calculations for agents in the second subset.

10. A non-transitory computer-readable storage medium for executing a simulation comprising a plurality of agents using multiple processing threads, wherein the storage medium stores instructions that, when executed by a simulation system comprising two or more processors, cause the simulation system to:
    group a plurality of agents in the simulated environment into a first subset and a second subset, wherein the first subset is associated with a first node of the simulated environment and the second subset is associated with a second node of the simulated environment;
    assign the first subset to a first processor of the two or more processors;

assign the second subset to a second processor of the two or more processors; and execute the simulation using a first processing thread associated with the first processor to perform calculations for agents in the first subset and using a second processing thread associated with the second processor to perform calculations for agents in the second subset.

11. The system of claim 4, wherein the one or more programs are further configured to be executable by one or more of the two or more processors to cause the system to:

if the system determines that an agent will not reach any inflection points during a current interval of the simulation, not assign the agent to any subsets for the current interval of the simulation.

12. The system of claim 4, wherein the one or more programs are further configured to be executable by one or more of the two or more processors to cause the system to:

if the system determines that an agent will not reach any inflection points during a current interval of the simulation, assign the agent to a subset associated with a next inflection point that the agent is projected to reach.

13. The system of claim 4, wherein the one or more programs are further configured to be executable by one or more of the two or more processors to cause the system to:

if the system determines that an agent will not reach any inflection points during a current interval of the simulation, assign the agent to a subset with one or more other agents that are nearby to the agent.

14. The system of claim 4, wherein the one or more programs are further configured to be executable by one or more of the two or more processors to cause the system to:

if the system determines that an agent will not reach any inflection points during a current interval of the simulation, assign the agent to a subset associated with an inflection point that is nearby to the agent.

15. The system of claim 4, wherein the one or more programs are further configured to be executable by one or more of the two or more processors to cause the system to:

if the system determines that an agent will not reach any inflection points during a current interval of the simulation, assign the agent to a subset that includes one or more other agents that are not projected to reach any inflection points during the current interval of the simulation.

\* \* \* \* \*